US012719027B2

(12) United States Patent
Shindo

(10) Patent No.: US 12,719,027 B2
(45) Date of Patent: Aug. 25, 2026

(54) PLASMA PROCESSING APPARATUS

(71) Applicant: TOKYO ELECTRON LIMITED, Tokyo (JP)

(72) Inventor: Takahiro Shindo, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 620 days.

(21) Appl. No.: 18/027,302

(22) PCT Filed: Sep. 16, 2021

(86) PCT No.: PCT/JP2021/034089
§ 371 (c)(1),
(2) Date: Mar. 20, 2023

(87) PCT Pub. No.: WO2022/070945
PCT Pub. Date: Apr. 7, 2022

(65) Prior Publication Data

US 2023/0335379 A1 Oct. 19, 2023

(30) Foreign Application Priority Data

Sep. 30, 2020 (JP) ................................ 2020-165670

(51) Int. Cl.
*H01J 37/32* (2006.01)
*C23C 16/458* (2006.01)
*C23C 16/515* (2006.01)

(52) U.S. Cl.
CPC .... *H01J 37/32568* (2013.01); *C23C 16/4585* (2013.01); *C23C 16/4586* (2013.01);
(Continued)

(58) Field of Classification Search
None
See application file for complete search history.

(56) References Cited

U.S. PATENT DOCUMENTS 8,608,851 B2 * 12/2013 Ni ............................ H05H 1/03 156/345.47
11,600,511 B2 * 3/2023 Cho .................. H01J 37/32642
(Continued)

FOREIGN PATENT DOCUMENTS

JP 2000-188286 A 7/2000
JP 2001-267310 A 9/2001
(Continued)

OTHER PUBLICATIONS

PCT International Search Report and Written Opinion, PCT Application No. PCT/JP2021/034089, Nov. 30, 2021, 9 pages.

*Primary Examiner* — Jeffrie R Lund
*Assistant Examiner* — Tiffany Z Nuckols
(74) *Attorney, Agent, or Firm* — Fenwick & West LLP

(57) ABSTRACT

There is provided a plasma processing apparatus comprising: a chamber; a gas supply configured to supply a processing gas into the chamber; an exhaust device configured to exhaust a gas within the chamber; a substrate support including a lower electrode electrically floating from a ground potential and provided within the chamber; an upper electrode provided above the substrate support; a power supply electrically connected to the upper electrode and configured to generate high frequency power or to periodically generate pulses of DC voltage; and a ring electrode provided around the substrate support so as to surround the substrate support and connected to ground.

4 Claims, 4 Drawing Sheets

(52) U.S. Cl.
CPC ...... *C23C 16/515* (2013.01); *H01J 37/32091* (2013.01); *H01J 37/32541* (2013.01); *H01J 37/32834* (2013.01); *H01J 2237/332* (2013.01)

(56) References Cited

U.S. PATENT DOCUMENTS

| | | | | |
|---|---|---|---|---|
| 2003/0029567 | A1* | 2/2003 | Dhindsa | H01J 37/32522 315/111.21 |
| 2007/0234960 | A1* | 10/2007 | Honda | H01J 37/32532 156/345.47 |
| 2008/0035605 | A1* | 2/2008 | Takahashi | H01L 21/67069 216/58 |
| 2010/0243608 | A1* | 9/2010 | Koshimizu | H01J 37/32577 134/1.1 |
| 2010/0279008 | A1* | 11/2010 | Takagi | C23C 16/409 118/725 |
| 2011/0100552 | A1* | 5/2011 | Dhindsa | H01J 37/32174 156/345.1 |
| 2014/0290576 | A1* | 10/2014 | Chen | H01J 37/32091 118/723 R |
| 2015/0243486 | A1 | 8/2015 | Yokogawa et al. | |
| 2020/0362457 | A1* | 11/2020 | Hu | C23C 16/45519 |

FOREIGN PATENT DOCUMENTS

| | | | |
|---|---|---|---|
| JP | 2003-179054 | A | 6/2003 |
| JP | 2004-165460 | A | 6/2004 |
| JP | 2015-162266 | A | 9/2015 |
| JP | 2020-095793 | A | 6/2020 |
| WO | WO 01/69642 | A2 | 9/2001 |

* cited by examiner

PLASMA PROCESSING APPARATUS

TECHNICAL FIELD

An exemplary embodiment of the present disclosure relates to a plasma processing apparatus.

BACKGROUND

A capacitively coupled plasma processing apparatus is used in plasma processing such as film formation processing. The capacitively coupled plasma processing apparatus comprises a chamber, a substrate support, an upper electrode, a gas supply, an exhaust device, and a high frequency power supply. The substrate support includes a lower electrode and is provided within the chamber. The upper electrode is provided above the lower electrode. The gas supply and the exhaust device are connected to the chamber. The high frequency power supply is connected to the upper electrode.

When plasma processing is performed, high frequency power is supplied from the high frequency power supply to the upper electrode while a gas is being supplied from the gas supply into the chamber. As a result, a plasma is generated from the gas within the chamber. A substrate on the substrate support is processed with chemical species from the generated plasma. For example, a film is formed on the substrate. Patent Documents 1 and 2 disclose such a capacitively coupled plasma processing apparatus.

PRIOR ART DOCUMENTS

Patent Documents

Patent Document 1: Japanese Laid-open Patent Publication No. 2001-267310

Patent Document 2: Japanese Laid-open Patent Publication No. 2003-179054

SUMMARY

Problems to Be Resolved by the Invention

The present disclosure provides a technique for attenuating ion bombardment to a substrate.

Means for Solving the Problems

In one exemplary embodiment, a plasma processing apparatus is provided. The plasma processing apparatus comprises a chamber, a gas supply, an exhaust device, a substrate support, an upper electrode, a power supply, and a ring electrode. The gas supply is configured to supply a processing gas into the chamber. The exhaust device is configured to exhaust a gas within the chamber. The substrate support includes a lower electrode electrically floating from a ground potential and is provided within the chamber. The upper electrode is provided above the substrate support. The power supply is electrically connected to the upper electrode and is configured to generate high frequency power or to periodically generate pulses of DC voltage. The ring electrode is provided around the substrate support so as to surround the substrate support and is connected to ground.

Effect of the Invention

According to one exemplary embodiment, it is possible to attenuate ion bombardment to a substrate.

DETAILED DESCRIPTION

Figure 1:
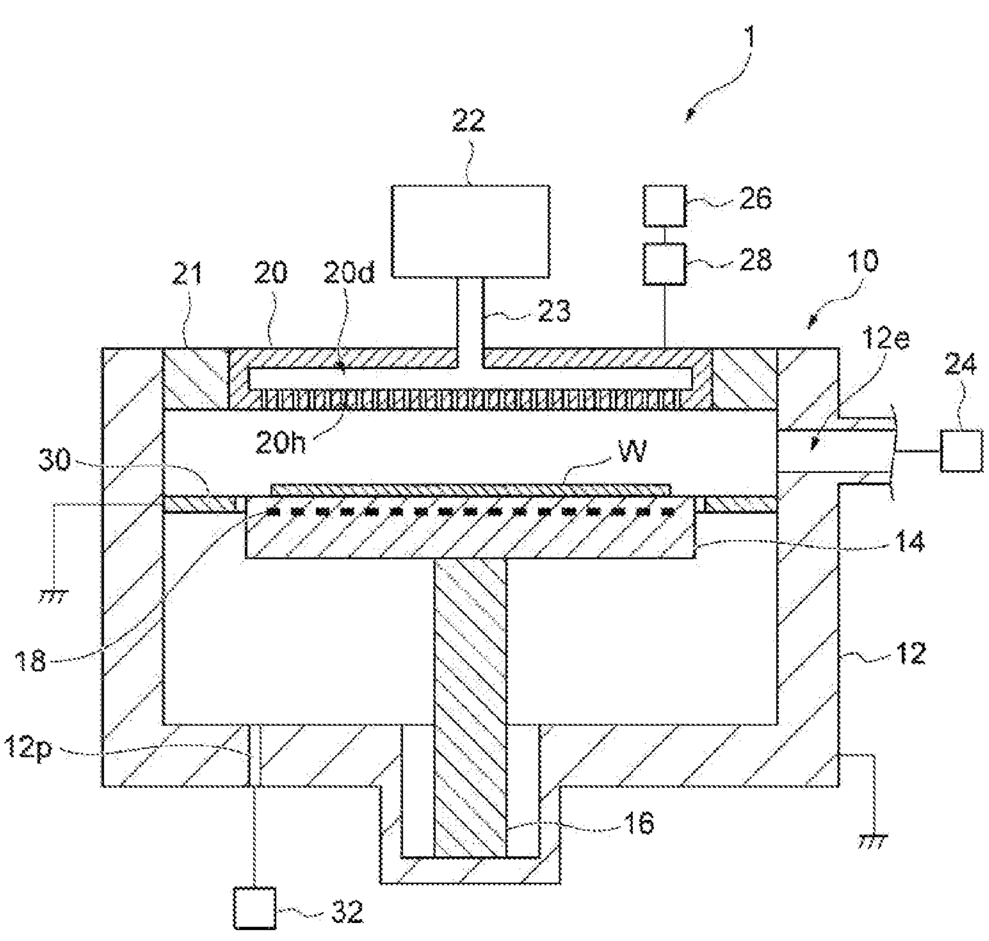
FIG. 1 is a diagram schematically showing a plasma processing apparatus according to one exemplary embodiment.

Various exemplary embodiments are described below.

In one exemplary embodiment, a plasma processing apparatus is provided. The plasma processing apparatus comprises a chamber, a gas supply, an exhaust device, a substrate support, an upper electrode, a power supply, and a ring electrode. The gas supply is configured to supply a processing gas into the chamber. The exhaust device is configured to exhaust a gas within the chamber. The substrate support includes a lower electrode electrically floating from a ground potential and is provided within the chamber. The upper electrode is provided above the substrate support. The power supply is electrically connected to the upper electrode and is configured to generate high frequency power or to periodically generate pulses of DC voltage. The ring electrode is provided around the substrate support so as to surround the substrate support and is connected to ground.

In the plasma processing apparatus of the above embodiment, the lower electrode is electrically floating from the ground potential. Accordingly, a discharge path is formed between the upper electrode and the ring electrode to generate plasma. In a state in which the plasma is being generated, a potential of the substrate on the substrate support follows a potential of the plasma. Therefore, a sheath voltage between the plasma and the substrate is reduced, and energy of ions colliding with the substrate is reduced. Therefore, according to the plasma processing apparatus of the above embodiment, it is possible to attenuate the ion bombardment to the substrate.

In one exemplary embodiment, the plasma processing apparatus may further comprise another gas supply. Said another gas supply supplies a purge gas such that the purge gas flows upwardly through a gap between the ring electrode and the substrate support. In this embodiment, the purge gas forms a flow against a flow of chemical species from the plasma toward the ring electrode. Therefore, the chemical species from the plasma are suppressed from adhering to the ring electrode. When plasma processing is a film formation processing for an insulating film, the insulating film is suppressed from being formed on the ring electrode.

In one exemplary embodiment, the plasma processing apparatus may further comprise a discharge electrode and another power supply. The discharge electrode is disposed along the ring electrode. Said another power supply is electrically connected to the discharge electrode. Said another power supply is configured to cause an electrical discharge between the discharge electrode and the ring electrode to generate charged particles flowing together with the purge gas. According to this embodiment, the charged particles generated around the discharge electrode promote the formation of the discharge path between the upper electrode and the ring electrode.

In one exemplary embodiment, the plasma processing apparatus may further comprise a dielectric portion. The dielectric portion is provided between the ring electrode and the discharge electrode.

In one exemplary embodiment, the power supply may periodically apply the pulses of DC voltage to the upper electrode. The plasma processing apparatus may further comprise a capacitor connected between the power supply and the upper electrode. According to this embodiment, when an insulating film is formed on a surface of the upper electrode, a voltage applied to the insulating film if there is no capacitor is divided between the capacitor and the insulating film. Therefore, dielectric breakdown of the insulating film on the surface of the upper electrode and a resulting abnormal discharge are suppressed.

In one exemplary embodiment, the plasma processing apparatus may further comprise a capacitor. The capacitor is connected between the lower electrode and the ground. According to this embodiment, the ion bombardment from the plasma to the substrate can be regulated by the capacitor.

In one exemplary embodiment, the processing gas may include a gas for forming an insulating film on the substrate placed on the substrate support.

Various exemplary embodiments are described in detail below with reference to the drawings. The same reference numeral is attached to a component which is the same or equivalent in each drawing.

FIG. 1 is a diagram schematically showing a plasma processing apparatus according to one exemplary embodiment. A plasma processing apparatus 1 shown in FIG. 1 comprises a chamber 10. The chamber 10 provides an internal space therein. The chamber 10 may include a chamber body 12. The chamber body 12 has a substantially cylindrical shape. The internal space of the chamber 10 is provided within the chamber body 12. The chamber body 12 is made of metal such as aluminum. The chamber body 12 is electrically grounded. A sidewall of the chamber body 12 may provide a passage through which a substrate W is transferred. Further, a gate valve may be provided along the sidewall of the chamber body 12 to open and close this passage.

The plasma processing apparatus 1 further comprises a substrate support 14. The substrate support 14 is provided within the chamber 10. The substrate support 14 is configured to support the substrate W placed thereon. The substrate support 14 has a main body. The main body of the substrate support 14 is made of, for example, aluminum nitride, and may have a disk shape. The substrate support 14 may be supported by a support member 16. The support member 16 extends upwardly from a bottom of the chamber 10. The substrate support 14 includes a lower electrode 18. The lower electrode 18 is embedded in the main body of the substrate support 14. The lower electrode 18 is electrically floating from a ground potential. A parasitic capacitance between the lower electrode 18 and ground may be 500 pF or less.

The plasma processing apparatus 1 further comprises an upper electrode 20. The upper electrode 20 is provided above the substrate support 14. The upper electrode 20 constitutes a ceiling of the chamber 10. The upper electrode 20 is electrically separated from the chamber body 12. In one embodiment, the upper electrode 20 is fixed to an upper part of the chamber body 12 via an insulating member 21.

In one embodiment, the upper electrode 20 is configured as a showerhead. The upper electrode 20 provides a gas diffusion space **20*d* therein. The upper electrode 20 further provides a plurality of gas holes 20*h*. The plurality of gas holes 20*h* extend downward from the gas diffusion space 20*d* and open toward the internal space of the chamber 10. That is, the plurality of gas holes 20*h* connect the gas diffusion space 20*d* and the internal space of the chamber 10**.

The plasma processing apparatus 1 further comprises a gas supply 22. The gas supply 22 is configured to supply gas into the chamber 10. The gas supply 22 is connected to the gas diffusion space **20*d* through a pipe 23. The gas supply 22 may have one or more gas sources, one or more flow controllers, and one or more on-off valves. Each of the one or more gas sources is connected to the pipe 23** via a corresponding flow controller and a corresponding on-off valve.

In one embodiment, the gas supply 22 may supply a film formation gas. That is, the plasma processing apparatus 1 may be a film formation apparatus. A film formed on the substrate W using the film formation gas may be an insulating film. In another embodiment, the gas supply 22 may supply an etching gas. That is, the plasma processing apparatus 1 may be a plasma etching apparatus.

The plasma processing apparatus 1 further comprises an exhaust device 24. The exhaust device 24 includes a pressure controller such as an automatic pressure control valve and a vacuum pump such as a turbomolecular pump or a dry pump. The exhaust device 24 is connected to the internal space of the chamber 10 via an exhaust pipe from an exhaust port **12*e* provided on the sidewall of the chamber body 12**.

The plasma processing apparatus 1 further comprises a power supply 26. In one embodiment, the power supply 26 generates high frequency power. A frequency of the high frequency power may be any frequency. The frequency of the high frequency power may be 13.56 MHz or less. The frequency of the high frequency power may be 2 MHz or less. The frequency of the high frequency power may be 20 kHz or higher.

The power supply 26 is connected to the upper electrode 20 via a matching box 28. The high frequency power from the power supply 26 is supplied to the upper electrode 20 via the matching box 28. The matching box 28 has a matching circuit that matches a load impedance of the power supply 26 to an output impedance of the power supply 26.

In another embodiment, the power supply 26 may be configured to periodically apply pulses of DC voltage to the upper electrode 20. A frequency that defines a cycle of applying the pulses of the DC voltage from the power supply 26 to the upper electrode 20 is, for example, 10 kHz or more and 10 MHz or less. When the power supply 26 is configured to periodically apply the pulses of the DC voltage to the upper electrode 20, the plasma processing apparatus 1 does not need to comprise the matching box 28.

The plasma processing apparatus 1 further comprises a ring electrode 30. The ring electrode 30 has an annular shape. The ring electrode 30 may be divided into a plurality of electrodes arranged along the circumferential direction. The ring electrode 30 is provided around the substrate support 14 so as to surround an outer circumference of the substrate support 14. A gap is provided between the ring electrode 30 and the outer circumference of the substrate support 14. The ring electrode 30 is connected to the ground.

In one embodiment, the plasma processing apparatus 1 further comprises a gas supply 32. The gas supply 32 supplies a purge gas so that the purge gas flows upwardly through the gap between the ring electrode 30 and the substrate support 14. The gas supply 32 supplies the purge gas into the chamber 10 through a gas introduction port 12*p*. In the illustrated example, the gas introduction port 12*p* is provided on a wall of the chamber body 12 below the substrate support 14. The purge gas supplied by the gas supply 32 may be an inert gas or may be, for example, a rare gas.

When plasma processing is performed on the substrate W in the plasma processing apparatus 1, a processing gas is supplied from the gas supply 22 into the chamber 10. The high frequency power or the pulses of the DC voltage is applied to the upper electrode 20 from the power supply 26. As a result, a plasma is generated from the processing gas within the chamber 10. The substrate W on the substrate support 14 is processed with chemical species from the generated plasma. For example, the chemical species from the plasma form a film on the substrate W. Alternatively, the chemical species from the plasma etch the substrate W.

In the plasma processing apparatus 1, the lower electrode 18 is electrically floating from the ground potential. Accordingly, a discharge path is formed between the upper electrode 20 and the ring electrode 30 to generate a plasma. In a state in which the plasma is being generated, a potential of the substrate W on the substrate support 14 follows a potential of the plasma. Therefore, a sheath voltage between the plasma and the substrate W is reduced, and energy of ions colliding with the substrate W is reduced. Therefore, according to the plasma processing apparatus 1, the ion bombardment to the substrate W is attenuated.

In one embodiment, the purge gas supplied from the gas supply 32 forms a flow against a flow of the chemical species from the plasma toward the ring electrode 30. Therefore, the chemical species from the plasma are suppressed from adhering to the ring electrode 30. When the plasma processing is a film formation processing for an insulating film, the insulating film is suppressed from being formed on the ring electrode 30.

Figure 2:
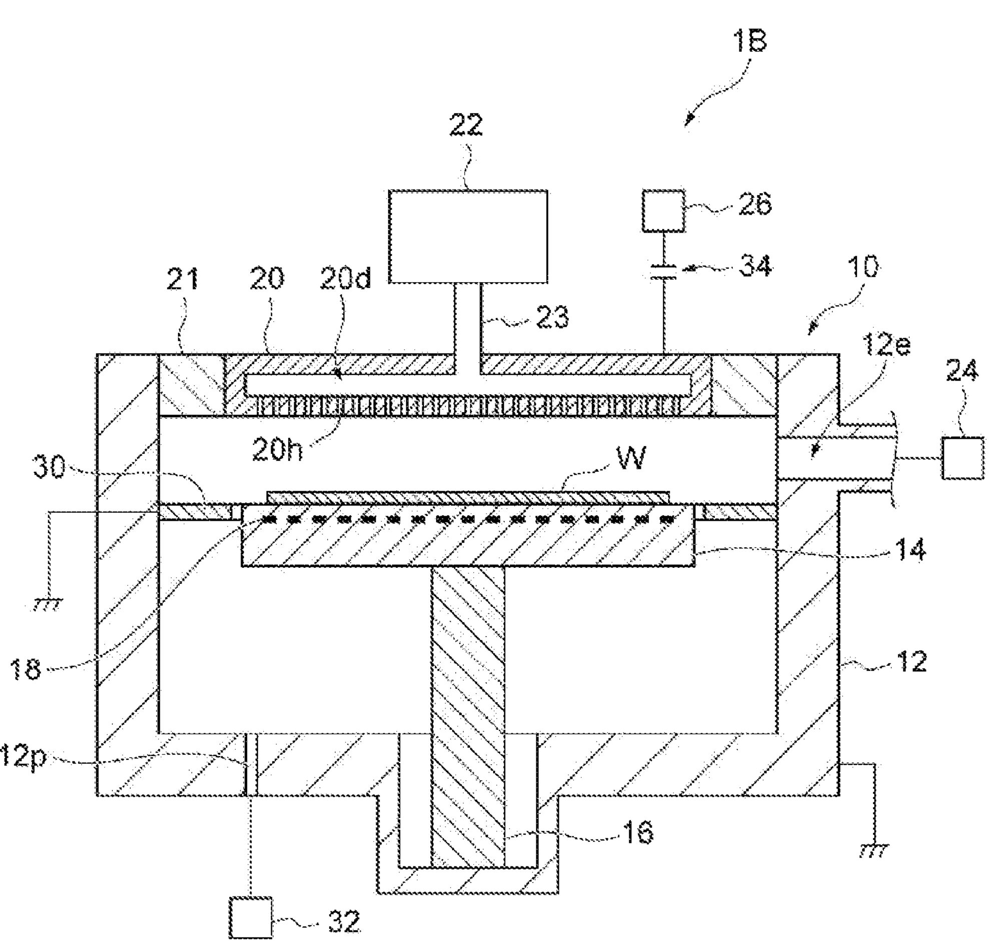
FIG. 2 is a diagram schematically showing a plasma processing apparatus according to another exemplary embodiment.

A plasma processing apparatus according to another exemplary embodiment will now be described with reference to FIG. 2. FIG. 2 is a diagram schematically showing a plasma processing apparatus according to another exemplary embodiment. In a plasma processing apparatus 1B shown in FIG. 2, the power supply 26 is configured to periodically apply pulses of DC voltage to the upper electrode 20. The plasma processing apparatus 1B comprises a capacitor 34. The capacitor 34 is connected between the power supply 26 and the upper electrode 20. Other configurations of the plasma processing apparatus 1B are the same as corresponding configurations of the plasma processing apparatus 1.

In the plasma processing apparatus 1, when the insulating film is formed on the surface of the upper electrode 20, the voltage applied to the insulating film if there is no capacitor 34 is divided between the capacitor 34 and the insulating film. Therefore, the dielectric breakdown of the insulating film on the surface of the upper electrode 20 and the resulting abnormal discharge are suppressed. The capacitor 34 may be selected such that it has a capacitance that is less than a capacitance of the insulating film that may be formed on the surface of the upper electrode 20.

Figure 3:
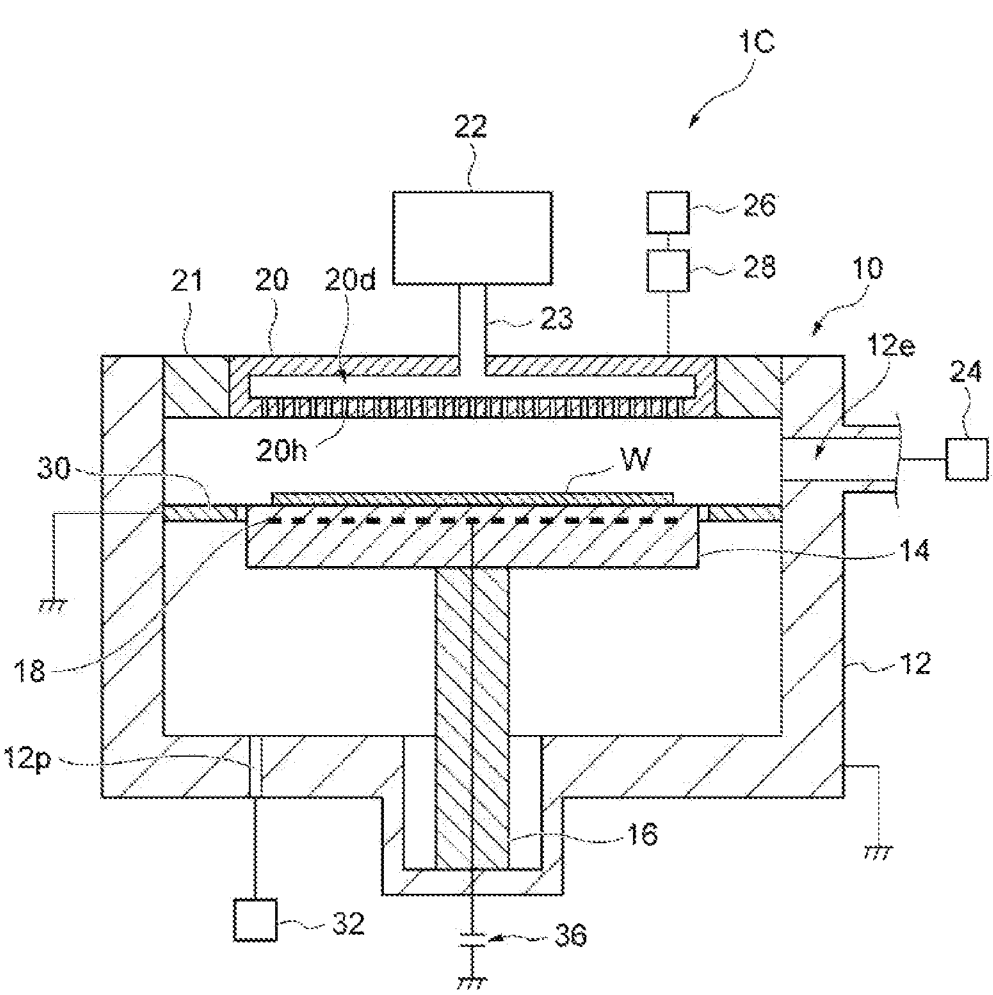
FIG. 3 is a diagram schematically showing a plasma processing apparatus according to yet another exemplary embodiment.

A plasma processing apparatus according to yet another exemplary embodiment will now be described with reference to FIG. 3. FIG. 3 is a diagram schematically showing a plasma processing apparatus according to yet another exemplary embodiment. A plasma processing apparatus 10 shown in FIG. 3 comprises a capacitor 36. The capacitor 36 is connected between the lower electrode 18 and the ground. Other configurations of the plasma processing apparatus 10 are the same as corresponding configurations of the plasma processing apparatus 1. According to the plasma processing apparatus 10, the ion bombardment to the substrate W from the plasma can be regulated by the capacitor 36. The greater a capacitance of the capacitor 36, the greater a ratio of power passing through a discharge path formed between the upper electrode 20 and the lower electrode 18, thereby increasing the ion bombardment to the substrate W from the plasma.

Figure 4:
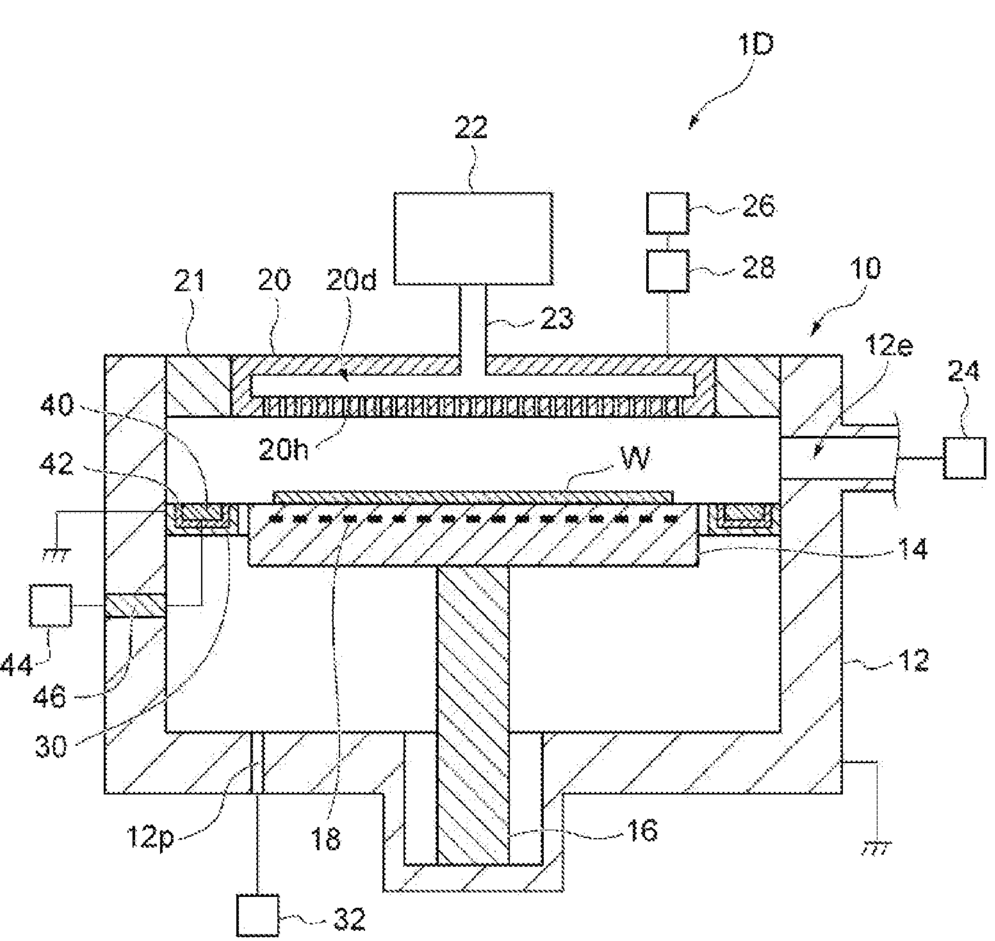
FIG. 4 is a diagram schematically showing a plasma processing apparatus according to yet another exemplary embodiment.

A plasma processing apparatus according to yet another exemplary embodiment will now be described with reference to FIG. 4. FIG. 4 is a diagram schematically showing a plasma processing apparatus according to yet another exemplary embodiment. A plasma processing apparatus 1D shown in FIG. 4 comprises a discharge electrode 40.

The discharge electrode 40 is disposed along the ring electrode 30. The discharge electrode 40 may have an annular shape and may be provided coaxially with the ring electrode 30. The discharge electrode 40 is disposed in a space defined by the ring electrode 30 or near the ring electrode 30. In the example shown in FIG. 4, the discharge electrode 40 is provided within a concave portion defined by the ring electrode 30. The discharge electrode 40 may be provided between the ring electrode 30 and the outer circumference of the substrate support 14. The discharge electrode 40 may be divided into a plurality of electrodes arranged along the ring electrode 30. That is, the plurality of electrodes constituting the discharge electrode 40 may be disposed at predetermined positions with respect to the ring electrode 30.

The plasma processing apparatus 1D may further comprise a dielectric portion 42. The dielectric portion 42 is made of a dielectric material. The dielectric portion 42 is provided between the ring electrode 30 and the discharge electrode 40.

The plasma processing apparatus 1D further comprises a power supply 44. The power supply 44 is used to cause an electrical discharge between the discharge electrode 40 and the ring electrode 30. The power supply 44 may be a high frequency power supply, a low frequency power supply, or a DC power supply. The power supply 44 is connected to the discharge electrode 40 via an introduction terminal 46. The introduction terminal 46 is provided on the wall of the chamber body 12. Other configurations of the plasma processing apparatus 1D may be the same as corresponding configurations of the plasma processing apparatus 1.

In the plasma processing apparatus 1D, an electrical discharge (for example, glow discharge) occurs between the discharge electrode 40 and the ring electrode 30. As a result, charged particles are generated around the discharge electrode 40. The generated charged particles move upward toward the exhaust port 12*e* along the flow of the purge gas supplied from the gas supply 32. Therefore, according to the plasma processing apparatus 1D, the charged particles promote the formation of the discharge path between the upper electrode 20 and the ring electrode 30.

While various exemplary embodiments have been described above, various additions, omissions, substitutions, and modifications may be made without being limited to the exemplary embodiments described above. Further, elements from different embodiments can be combined to form other embodiments.

From the above description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, with a true scope and spirit being indicated by the following claims.

DESCRIPTION OF REFERENCE NUMERALS

1: plasma processing apparatus, 10: chamber, 14: substrate support, 18: lower electrode, 20: upper electrode, 22: gas supply, 24: exhaust device, 26: power supply, 30: ring electrode

The invention claimed is:

1. A plasma processing apparatus comprising:

a chamber;

a first gas supply configured to supply a processing gas into the chamber;

an exhaust device configured to exhaust a gas within the chamber;

a substrate support including a lower electrode electrically floating from a ground potential and provided within the chamber;

an upper electrode provided above the substrate support;

a first power supply electrically connected to the upper electrode and configured to generate high frequency power or to periodically generate pulses of DC voltage;

a ring electrode provided around the substrate support so as to surround the substrate support and connected to ground;

a second gas supply that supplies a purge gas such that the purge gas flows upwardly through a gap between the ring electrode and the substrate support;

a discharge electrode disposed along the ring electrode;

a second power supply electrically connected to the discharge electrode and configured to cause an electrical discharge between the discharge electrode and the ring electrode; and a dielectric portion provided between the ring electrode and the discharge electrode, wherein the exhaust device is configured to exhaust the gas within the chamber via an exhaust port provided on a sidewall of the chamber and disposed above the ring electrode, the second gas supply supplies the purge gas through a gas introduction port provided on a wall of the chamber below the substrate support, and the discharge electrode and the dielectric portion are provided within a concave portion defined by the ring electrode.

2. The plasma processing apparatus of claim 1, wherein the first power supply periodically applies the pulses of the DC voltage to the upper electrode, and the plasma processing apparatus further comprises a capacitor connected between the first power supply and the upper electrode.

3. The plasma processing apparatus of claim 1, further comprising:

a capacitor connected between the lower electrode and the ground.

4. The plasma processing apparatus of claim 1, wherein the processing gas includes a gas for forming an insulating film on a substrate placed on the substrate support.

* * * * *